(12) United States Patent
Sugiyama et al.

(10) Patent No.: US 12,444,668 B2
(45) Date of Patent: Oct. 14, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Toru Sugiyama, Tokyo (JP); Akira Yoshioka, Yokohama Kanagawa (JP); Hitoshi Kobayashi, Yamato Kanagawa (JP); Hung Hung, Kawasaki Kanagawa (JP); Yasuhiro Isobe, Tokyo (JP); Hideki Sekiguchi, Yokohama Kanagawa (JP); Tetsuya Ohno, Yokohama Kanagawa (JP); Masaaki Onomura, Tokyo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 332 days.

(21) Appl. No.: 18/181,084

(22) Filed: Mar. 9, 2023

(65) Prior Publication Data

US 2024/0105563 A1    Mar. 28, 2024

(30) Foreign Application Priority Data

Sep. 22, 2022 (JP) .................... 2022-151306

(51) Int. Cl.
*H01L 23/495* (2006.01)
*H01L 25/16* (2023.01)
*H10D 30/47* (2025.01)

(52) U.S. Cl.
CPC .. *H01L 23/49575* (2013.01); *H01L 23/49503* (2013.01); *H01L 23/4952* (2013.01);
(Continued)

(58) Field of Classification Search
CPC ............. H01L 23/142; H01L 23/49575; H01L 23/49503; H01L 23/4951; H01L 23/4952;
(Continued)

(56) References Cited

U.S. PATENT DOCUMENTS 7,875,907 B2    1/2011  Honea et al.
9,123,536 B2    9/2015  Ikeda
(Continued)

FOREIGN PATENT DOCUMENTS

JP    2009200149 A    9/2009
JP    2011-142265 A   7/2011
(Continued)

OTHER PUBLICATIONS

Notice of Reasons for Refusal (Office Action) mailed Aug. 29, 2025 in counterpart Japanese Patent Application No. 2022-151306, with English machine translation, 7 pages.

*Primary Examiner* — Lauren R Bell
(74) *Attorney, Agent, or Firm* — Kim & Stewart LLP

(57) ABSTRACT

A semiconductor device includes a nitride semiconductor element, a first diode, and a second diode; the nitride semiconductor element includes a conductive mounting bed, a semiconductor substrate formed on the mounting bed, a first nitride semiconductor layer, a second nitride semiconductor layer, a first major electrode, a second major electrode, a first gate electrode, and a second gate electrode; the first diode includes a first anode electrode electrically connected to the mounting bed, and a first cathode electrode electrically connected to the first major electrode; and the second diode includes a second anode electrode electrically connected to the mounting bed, and a second cathode electrode electrically connected to the second major electrode.

7 Claims, 5 Drawing Sheets

(52) U.S. Cl.
CPC ........ *H01L 23/49562* (2013.01); *H01L 25/16* (2013.01); *H10D 30/471* (2025.01)

(58) Field of Classification Search
CPC . H01L 23/49562; H01L 25/16; H01L 29/778; H10D 30/471–476; H10D 84/811; H10D 80/20; H10D 80/251; H10D 80/231
See application file for complete search history.

(56) References Cited

U.S. PATENT DOCUMENTS

| | | | |
|---|---|---|---|
| 2009/0206363 A1* | 8/2009 | Machida | H10D 30/4755 257/133 |
| 2014/0284610 A1 | 9/2014 | Yoshioka et al. | |
| 2015/0262997 A1* | 9/2015 | Sato | H01L 24/05 257/76 |
| 2017/0103978 A1* | 4/2017 | Prechtl | H01L 23/49503 |
| 2019/0068181 A1* | 2/2019 | Leong | H10D 84/01 |
| 2019/0326280 A1* | 10/2019 | Imam | H10D 8/00 |
| 2024/0421139 A1* | 12/2024 | Bisi | H01L 24/32 |

FOREIGN PATENT DOCUMENTS

| | | |
|---|---|---|
| JP | 2013-042270 A | 2/2013 |
| JP | 2014187086 A | 10/2014 |
| JP | 6113542 B2 | 4/2017 |

\* cited by examiner

SEMICONDUCTOR DEVICE

CROSS-REFERENCE TO RELATED APPLICATIONS

This application is based upon and claims the benefit of priority from Japanese Patent Application No. 2022-151306, filed on Sep. 22, 2022; the entire contents of which are incorporated herein by reference.

FIELD

Embodiments described herein relate generally to a semiconductor device.

BACKGROUND

A nitride semiconductor device that uses a nitride semiconductor such as GaN or the like having a heterojunction can realize a higher breakdown voltage, a lower on-resistance, and a faster operation than a semiconductor device using Si.

However, although a lateral nitride semiconductor device in which the source/drain and gate are formed in the same plane has the advantage of the current flowing in two directions, it is known that a current collapse phenomenon occurs when a high voltage is applied between the drain and the source, in which the drain current that can be output fluctuates and causes characteristic degradation such as higher on-resistance, etc.

Generally, to avoid the current collapse phenomenon and ensure the reliability, the back surface of the nitride semiconductor device is set to the same potential as the source potential, but it is necessary to maintain the nitride semiconductor layer in which the channel is formed at a lower voltage than the voltage applied to the drain electrode, to which a high voltage is applied. Under such constraints, it is difficult to apply nitride semiconductor devices in bidirectional switches.

DETAILED DESCRIPTION

A semiconductor device according to an embodiment includes a nitride semiconductor element, a first diode, and a second diode; the nitride semiconductor element includes a conductive mounting bed, a semiconductor substrate formed on the mounting bed, a first nitride semiconductor layer formed on the semiconductor substrate, a second nitride semiconductor layer located on the first nitride semiconductor layer, a first major electrode located on the first nitride semiconductor layer, a second major electrode located on the first nitride semiconductor layer and separated from the first major electrode, a first gate electrode located between the first major electrode and the second major electrode on the second nitride semiconductor layer, and a second gate electrode located between the first gate electrode and the second major electrode on the second nitride semiconductor layer; the first diode includes a first anode electrode electrically connected to the mounting bed, and a first cathode electrode electrically connected to the first major electrode; and the second diode includes a second anode electrode electrically connected to the mounting bed, and a second cathode electrode electrically connected to the second major electrode.

First Embodiment

Figure 1:
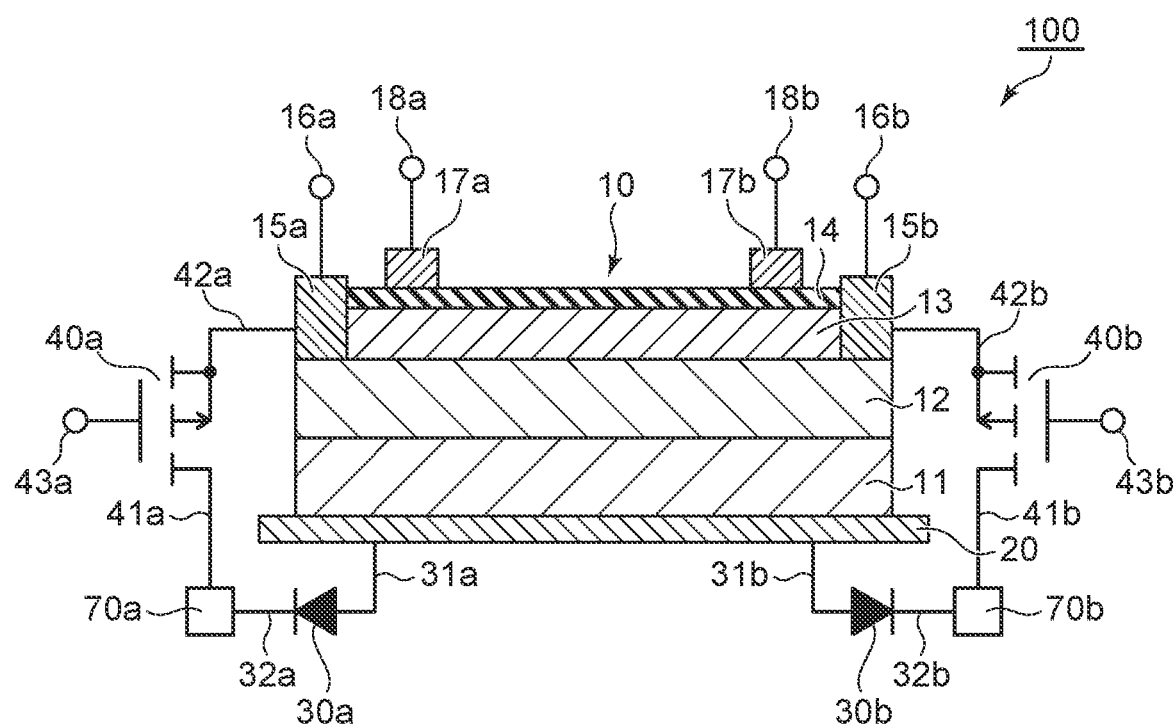
FIG. 1 is a schematic view illustrating a semiconductor device according to a first embodiment.

FIG. 1 is a schematic view illustrating a semiconductor device according to a first embodiment.

As shown in FIG. 1, the semiconductor device 100 according to the embodiment includes a nitride semiconductor element 10, a first diode 30a, a second diode 30b, a first semiconductor element 40a, and a second semiconductor element 40b.

FIG. 1 is a schematic cross-sectional view for describing the configuration of the nitride semiconductor element 10. FIG. 1 also shows the electrical connectional relationship between the nitride semiconductor element 10, the first diode 30a, the second diode 30b, the first semiconductor element 40a, and the second semiconductor element 40b.

The nitride semiconductor element 10 includes a substrate 11, a first nitride semiconductor layer 12, a second nitride semiconductor layer 13, a first SD electrode (a first major electrode) 15a, a second SD electrode (a second major electrode) 15b, a first gate electrode 17a, and a second gate electrode 17b. The first nitride semiconductor layer 12 is located on the substrate 11. The substrate 11 is conductive. In the example, the substrate 11 is a low-resistance Si substrate. The second nitride semiconductor layer 13 is located on the first nitride semiconductor layer 12. The substrate 11 is formed on a conductive first mounting bed (mounting bed) 20.

The first nitride semiconductor layer 12 and the second nitride semiconductor layer 13 are stacked with a heterojunction interposed. The first nitride semiconductor layer 12 and the second nitride semiconductor layer 13 have different lattice constants. The bandgap of the nitride semiconductor of the second nitride semiconductor layer 13 is wider than the bandgap of the nitride semiconductor of the first nitride semiconductor layer 12. Therefore, a two-dimensional electron gas is induced in the first nitride semiconductor layer 12 at the heterojunction vicinity. The two-dimensional electron gas functions as a channel of the nitride semiconductor element 10 for electrons having high mobility. The first nitride semiconductor layer 12 is, for example, an undoped GaN layer. The second nitride semiconductor layer 13 is, for example, an AlGaN layer. An AlN layer may be formed as the layer under the AlGaN layer.

The first SD electrode 15a and the second SD electrode 15b are located on the first nitride semiconductor layer 12. The first SD electrode 15a and the second SD electrode 15b are separated from each other on the first nitride semiconductor layer 12. The first SD electrode 15a and the second SD electrode 15b are connected with the first nitride semiconductor layer 12.

The first SD electrode 15a and the second SD electrode 15b also are connected with the second nitride semiconductor layer 13. In the example, the connection between the first SD electrode 15a and the second nitride semiconductor layer 13 is realized by a junction between the side surface of the first SD electrode 15a and the side surface of the second nitride semiconductor layer 13. The connection between the second SD electrode 15b and the second nitride semiconductor layer 13 is realized by a junction between the side surface of the second SD electrode 15b and the side surface of the second nitride semiconductor layer 13. The first SD electrode 15a and the second SD electrode 15b may be provided on the second nitride semiconductor layer 13.

The first gate electrode 17a and the second gate electrode 17b are located on an insulating film 14 (ex. a dielectric file such as an oxide film or a nitride film) that is located on the second nitride semiconductor layer 13. The first gate electrode 17a and the second gate electrode 17b are separated from each other on the insulating film 14. The first gate electrode 17a and the second gate electrode 17b are located between the first SD electrode 15a and the second SD electrode 15b. The first gate electrode 17a is located between the second gate electrode 17b and the first SD electrode 15a. The second gate electrode 17b is located between the second SD electrode 15b and the first gate electrode 17a.

The distance between the first SD electrode 15a and the first gate electrode 17a is substantially equal to the distance between the second SD electrode 15b and the second gate electrode 17b. The distance between the first gate electrode 17a and the second gate electrode 17b is greater than the distance between the first SD electrode 15a and the first gate electrode 17a. The distance between the first gate electrode 17a and the second gate electrode 17b is greater than the distance between the second SD electrode 15b and the second gate electrode 17b.

The nitride semiconductor element 10 is a normally-on HEMT. The channel that is formed of the two-dimensional electron gas formed in the first nitride semiconductor layer 12 is blocked by applying a lower voltage than a first threshold voltage between the first gate electrode 17a and the first SD electrode 15a.

The first threshold voltage is defined as the voltage applied to the first gate electrode 17a when referenced to the voltage applied to the first SD electrode 15a. The first threshold voltage is a negative voltage value with respect to the voltage applied to the first SD electrode 15a.

Also, the channel that is formed of the two-dimensional electron gas is blocked by applying a lower voltage than a second threshold voltage between the second gate electrode 17b and the second SD electrode 15b. The second threshold voltage is defined as the voltage applied to the second gate electrode 17b when referenced to the voltage applied to the second SD electrode 15b. The second threshold voltage is a negative voltage value with respect to the voltage applied to the second SD electrode 15b. The second threshold voltage is substantially equal to the first threshold voltage.

The nitride semiconductor element 10 is set to the on-state by applying a voltage that is not less than the first threshold voltage between the first gate electrode 17a and the first SD electrode 15a and by applying a voltage that is not less than the second threshold voltage between the second gate electrode 17b and the second SD electrode 15b. The on-state of the nitride semiconductor element 10 is a state in which a current flows from the first SD electrode 15a toward the second SD electrode 15b or a state in which a current flows from the second SD electrode 15b toward the first SD electrode 15a.

In the semiconductor device 100 according to the embodiment, an anode electrode 31a of the first diode 30a is electrically connected to the substrate 11 via the first mounting bed 20; and a cathode electrode 32a of the first diode 30a is electrically connected to the first SD electrode 15a. In the semiconductor device 100, an anode electrode 31b of the second diode 30b is electrically connected to the substrate 11 via the first mounting bed 20; and a cathode electrode 32b of the second diode 30b is electrically connected to the second SD electrode. Thus, when the second semiconductor element 40b is in the on-state and the voltage applied to the first SD electrode 15a is greater than the voltage applied to the second SD electrode 15b, the second diode 30b is switched on, the first diode 30a is switched off, and the substrate 11 and the second SD electrode 15b have substantially the same potential. In such a case, the semiconductor device 100 functions as a low-on-resistance high-breakdown voltage switching device in which the current flows in the direction from the first SD electrode 15a toward the second SD electrode 15b. When the first semiconductor element 40a is in the on-state and the voltage applied to the second SD electrode 15b is greater than the voltage applied to the first SD electrode 15a, the first diode 30a is switched on, the second diode 30b is switched off, and the substrate 11 and the first SD electrode 15a have substantially the same potential. In such a case, the semiconductor device 100 functions as a low-on-resistance high-breakdown voltage switching device in which the current flows in the direction from the second SD electrode 15b toward the first SD electrode 15a. That is, the semiconductor device 100 according to the embodiment can function as a low-on-resistance high-breakdown voltage bidirectional switching device.

The nitride semiconductor element 10 is switched to the off-state by applying a lower voltage than the first threshold voltage between the first gate electrode 17a and the first SD electrode 15a or by applying a lower voltage than the second threshold voltage between the second gate electrode 17b and the second SD electrode 15b. The off-state of the nitride semiconductor element 10 is a blocked state in which the current that flows between the first SD electrode 15a and the second SD electrode 15b is sufficiently low compared to the current flowing in the on-state.

The nitride semiconductor element 10 is located on the first mounting bed 20. The first mounting bed 20 is a highly-conductive plate-shaped member that includes a metal material such as Cu, etc. The substrate 11 has an ohmic connection with the first mounting bed 20.

The nitride semiconductor element 10 includes a first power supply terminal 16a, a second power supply terminal 16b, a first control terminal 18a, and a second control terminal 18b. The first power supply terminal 16a is electrically connected to the first SD electrode 15a. The second power supply terminal 16b is electrically connected to the second SD electrode 15b. The first control terminal 18a is electrically connected to the first gate electrode 17a. The second control terminal 18b is electrically connected to the second gate electrode 17b. The first SD electrode 15a, the second SD electrode 15b, the first gate electrode 17a, and the second gate electrode 17b are electrically connected to an external circuit respectively via the first power supply terminal 16a, the second power supply terminal 16b, the first control terminal 18a, and the second control terminal 18b.

The anode electrode (the first anode electrode) 31a of the first diode 30a is electrically connected with the first mounting bed 20. The cathode electrode (the first cathode electrode) 32a of the first diode 30a is electrically connected to a drain electrode (a first drain electrode) 41a of the first semiconductor element 40a. The anode electrode (the second anode electrode) 31b of the second diode 30b is electrically connected with the first mounting bed 20. The cathode electrode (the second cathode electrode) 32b of the second diode 30b is electrically connected to a drain electrode (a second drain electrode) 41b of the second semiconductor element 40b. The first diode 30a and the second diode 30b are, for example, Si diodes. As long as the breakdown voltage between the cathode and the anode is not less than the breakdown voltage between the first SD electrode 15a and the second SD electrode 15b of the nitride semiconductor element 10, the first diode 30a and the second diode 30b are not limited to Si diodes and may be diodes formed of other semiconductor materials or Schottky barrier diodes.

A source electrode 42a of the first semiconductor element 40a is electrically connected to the first SD electrode 15a. The gate electrode of the first semiconductor element 40a is electrically connected to a gate terminal 43a. A source electrode 42b of the second semiconductor element 40b is electrically connected to the second SD electrode 15b. The gate electrode of the second semiconductor element 40b is electrically connected to a gate terminal 43b. The first semiconductor element 40a and the second semiconductor element 40b are p-channel normally-off switching elements. The first semiconductor element 40a and the second semiconductor element 40b are, for example, p-channel MOSFETs formed of Si.

The first semiconductor element 40a has a negative threshold voltage. In a p-channel MOSFET, a negative threshold voltage is when the voltage applied to the gate electrode is a negative voltage with respect to the voltage applied to the source electrode. Similarly to the first semiconductor element 40a, the second semiconductor element 40b also is a p-channel MOSFET and has a negative threshold voltage. A p-channel MOSFET is switched on by applying a lower voltage than the threshold voltage between the gate electrode and the source electrode. A p-channel MOSFET is switched off by applying a voltage that is not less than the threshold voltage between the gate electrode and the source electrode. It is favorable for the threshold voltage of the first semiconductor element 40a and the threshold voltage of the second semiconductor element 40b to be substantially equal. According to a method of use described below, these thresholds may not be equal if the absolute values of these thresholds are sufficiently less than a power supply voltage VDD shown in FIG. 4.

The cathode electrode 32a of the first diode 30a and the drain electrode 41a of the first semiconductor element 40a are electrically connected to a first output terminal 70a. The cathode electrode 32b of the second diode 30b and the drain electrode 41b of the second semiconductor element 40b are electrically connected to a second output terminal 70b.

Figure 2:
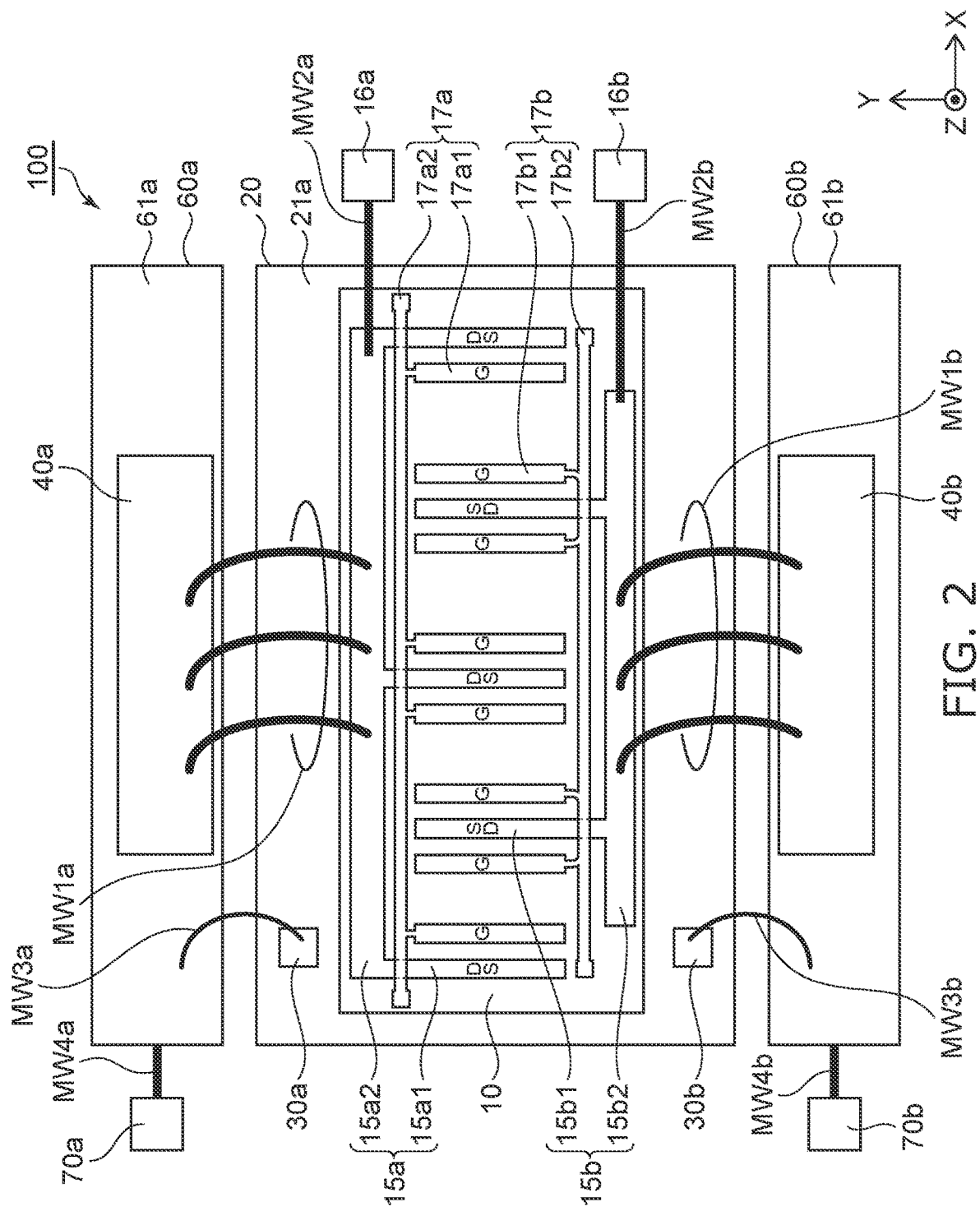
FIG. 2 is a plan view illustrating the semiconductor device according to the first embodiment.

FIG. 2 is a plan view illustrating the semiconductor device according to the first embodiment.

Figure 3:
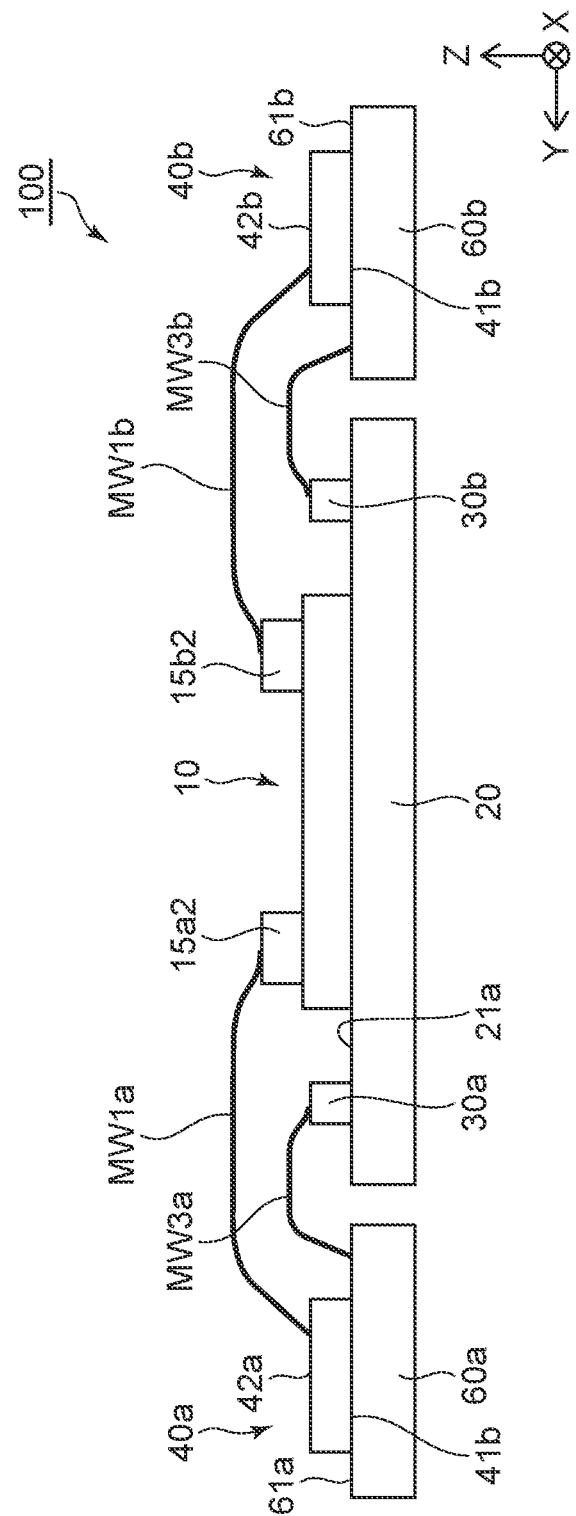
FIG. 3 is a side view illustrating the semiconductor device according to the first embodiment.

FIG. 3 is a side view illustrating the semiconductor device according to the first embodiment.

XYZ coordinate axes may be used when describing the configuration of the semiconductor device 100 according to the embodiment. The XYZ coordinate axes are defined as follows. As shown in FIGS. 2 and 3, the first mounting bed 20 is a substantially rectangular plate-shaped member. The first mounting bed 20 includes a surface 21a. The nitride semiconductor element 10 is located on the surface 21a. The XY plane is parallel to the surface 21a. The X-axis is parallel to the long sides of the first mounting bed 20. The Y-axis is parallel to the short sides of the first mounting bed 20. The Z-axis is perpendicular to the X-axis and the Y-axis. The positive direction of the Z-axis is the direction from the surface opposite to the surface 21a toward the surface 21a. Viewing from the positive direction of the Z-axis also may be called viewing in plan or viewing in top-view. FIG. 3 is a side view facing the YZ plane and is viewed toward the positive direction of the X-axis.

In the example as shown in FIG. 2, the outer perimeter of the nitride semiconductor element 10 when viewed in plan has a substantially rectangular shape. The shape of the outer perimeter of the nitride semiconductor element 10 when viewed in plan is not limited to rectangular and may be square. The outer perimeter of the nitride semiconductor element 10 when viewed in plan includes long sides substantially parallel to the X-axis. The outer perimeter of the nitride semiconductor element 10 when viewed in plan includes short sides substantially parallel to the Y-axis.

The first SD electrode 15a includes a first electrode 15a1 and a second electrode 15a2. The first electrode 15a1 has a substantially rectangular shape including long sides substantially parallel to the Y-axis direction. Three first electrodes 15a1 are provided in the example. The three first electrodes 15a1 each include long sides substantially parallel to the Y-axis. The three first electrodes 15a1 are arranged at substantially uniform spacing to be separated in the X-axis direction.

The second electrode 15a2 has a rectangular shape including long sides parallel to the X-axis direction. The second electrode 15a2 is located at the outer perimeter of the nitride semiconductor element 10 at one long side. The three first electrodes 15a1 are connected to the second electrode 15a2 at one Y-axis-direction end portion each. The second electrode 15a2 functions as a connection member that connects the three first electrodes 15a1 in parallel.

The second SD electrode 15b includes a third electrode 15b1 and a fourth electrode 15b2. The third electrode 15b1 has a substantially rectangular shape including long sides substantially parallel to the Y-axis direction. Two third electrodes 15b1 are provided in the example. The two third electrodes 15b1 each include long sides parallel to the Y-axis. One of the two third electrodes 15b1 is located between two adjacent first electrodes 15a1. The other one of the two third electrodes 15b1 is located between the other two adjacent first electrodes 15a1. The third electrode (the second portion) 15b1 is positioned at substantially ½ of the distance between the two adjacent first electrodes (first portions) 15a1. In such a case, the distance between the electrodes refers to the distance between the center lines of the first and third electrodes 15a1 and 15b1 extending in the Y-axis direction.

The fourth electrode 15b2 has a substantially rectangular shape including long sides parallel to the X-axis direction. The fourth electrode 15b2 is located at the outer perimeter of the nitride semiconductor element 10 at the other long side at a position opposite to the long side at which the second electrode 15a2 is located.

Two third electrodes 15b1 are connected to the fourth electrode 15b2 at one Y-axis-direction end portion each. The fourth electrode 15b2 functions as a connection member that connects the two third electrodes 15b1 in parallel.

The second electrode 15a2 and the fourth electrode 15b2 each function as connection pads. In the example as shown in FIGS. 2 and 3, one end portion of each of three bonding wires MW1a is connected to the second electrode 15a2. The other end portion of each of the three bonding wires MW1a is connected to the source electrode 42a of the first semiconductor element 40a. One end portion of each of three bonding wires MW1b is connected to the fourth electrode 15b2. The other end portion of each of the three bonding wires MW1b is connected to the source electrode 42b of the second semiconductor element 40b.

The first gate electrode 17a includes a fifth electrode 17a1 and a sixth electrode 17a2. The fifth electrode 17a1 has a substantially rectangular shape including long sides substantially parallel to the Y-axis direction. Four fifth electrodes 17a1 are provided in the example. The four fifth electrodes 17a1 each include long sides substantially parallel to the Y-axis. The four fifth electrodes 17a1 are separated in the X-axis direction.

The sixth electrode 17a2 has a substantially rectangular shape including long sides substantially parallel to the X-axis direction. The sixth electrode 17a2 is located adjacent to the second electrode 15a2. One Y-axis-direction end portion of each of the four fifth electrodes 17a1 is connected to the sixth electrode 17a2. The sixth electrode 17a2 functions as a connection member that connects the four fifth electrodes 17a1 in parallel.

The second gate electrode 17b includes a seventh electrode 17b1 and an eighth electrode 17b2. The seventh electrode 17b1 has a substantially rectangular shape including long sides substantially parallel to the Y-axis direction. Four seventh electrodes 17b1 are provided in the example. Each of the four seventh electrodes 17b1 includes long sides substantially parallel to the Y-axis. The four seventh electrodes 17b1 are separated from each other in the X-axis direction.

The eighth electrode 17b2 has a substantially rectangular shape including long sides substantially parallel to the X-axis direction. The eighth electrode 17b2 is located adjacent to the fourth electrode 15b2. The sixth electrode 17a2 and the eighth electrode 17b2 are located at positions facing each other. In the example, the sixth electrode 17a2 and the eighth electrode 17b2 are located between the second electrode 15a2 and the fourth electrode 15b2.

The eighth electrode 17b2 electrically connects the four seventh electrodes 17b1 at one end portion of each of the four seventh electrodes 17b1. The eighth electrode 17b2 functions as a connection member that connects the four seventh electrodes 17b1 in parallel.

The sixth electrode 17a2 and the eighth electrode 17b2 each function as connection pads. One end portion of a bonding wire MW2a is connected to the sixth electrode 17a2. The other end portion of the bonding wire MW2a is connected to the first power supply terminal 16a. One end portion of a bonding wire MW2b is connected to the eighth electrode 17b2. The other end portion of the bonding wire MW2b is connected to the second power supply terminal 16b.

The adjacent fifth electrode 17a1 and seventh electrode 17b1 are located between the adjacent first electrode 15a1 and third electrode 15b1. In such a case, the spacing between the first electrode 15a1 and the fifth electrode 17a1 is substantially equal to the spacing between the third electrode 15b1 and the seventh electrode 17b1. The spacing between the fifth electrode 17a1 and the seventh electrode 17b1 is determined according to the voltage applied between the first electrode 15a1 and the third electrode 15b1. The spacing between the fifth electrode 17a1 and the seventh electrode 17b1 is increased as the voltage applied between the first electrode 15a1 and the third electrode 15b1 is increased. The spacing between the fifth electrode 17a1 and the seventh electrode 17b1 is greater than the spacing between the first electrode 15a1 and the third electrode 15b1.

In the example, the set of the first electrode 15a1, the fifth electrode 17a1, the seventh electrode 17b1, and the third electrode 15b1 and the set of the third electrode 15b1, the seventh electrode 17b1, the fifth electrode 17a1, and the first electrode 15a1 share the third electrode 15b1 and are arranged in this order toward the positive direction of the X-axis. Also, the set of the third electrode 15b1, the seventh electrode 17b1, the fifth electrode 17a1, and the first electrode 15a1 and the set of the first electrode 15a1, the fifth electrode 17a1, the seventh electrode 17b1, and the third electrode 15b1 share the first electrode 15a1 and are arranged in this order toward the positive direction of the X-axis. Also, the set of the first electrode 15a1, the fifth electrode 17a1, the seventh electrode 17b1, and the third electrode 15b1 and the set of the third electrode 15b1, the seventh electrode 17b1, the fifth electrode 17a1, and the first electrode 15a1 share the third electrode 15b1 and are arranged in this order toward the positive direction of the X-axis.

As in the example, a sufficient gate width can be obtained by providing multiple gate electrodes, i.e., the fifth electrode 17a1 and the seventh electrode 17b1, connected in parallel. Multiple SD electrodes, i.e., the first electrode 15a1 and the third electrode 15b1, are provided according to the number of gate electrodes and are connected in parallel.

Outer perimeters of a second mounting bed 60a and a third mounting bed 60b have substantially rectangular shapes including long sides parallel to the X-axis when viewed in plan. A long side of the second mounting bed 60a is located adjacent to one long side of the first mounting bed 20. A long side of the third mounting bed 60b is located adjacent to the other long side of the first mounting bed 20. As shown in FIG. 3, the second mounting bed 60a is located so that a surface 61a of the second mounting bed 60a at the positive-direction side of the Z-axis is in substantially the same plane as the surface 21a of the first mounting bed 20. Third mounting bed 60b is located so that a surface 61b of the third mounting bed 60b at the positive-direction side of the Z-axis is in substantially the same plane as the surface 21a of the first mounting bed 20.

The second mounting bed 60a and the third mounting bed 60b are highly-conductive plate-like members that include a metal material such as Cu, etc. For example, the second mounting bed 60a and the third mounting bed 60b are formed of the same metal material as the first mounting bed 20.

The first semiconductor element 40a is located on the second mounting bed 60a. The drain electrode 41a of the first semiconductor element 40a is connected to the second mounting bed 60a. The second semiconductor element 40b is located on the third mounting bed 60b. The second semiconductor element 40b is connected to the third mounting bed 60b.

In the example, the first semiconductor element 40a and the second semiconductor element 40b each are vertical semiconductor elements. The drain electrode 41a of the first semiconductor element 40a and the drain electrode 41b of the second semiconductor element 40b are formed at the back surfaces of the semiconductor elements. The drain electrode 41a is electrically connected to the second mounting bed 60a by the drain electrode 41a having an ohmic connection with the second mounting bed 60a. The drain electrode 41b is electrically connected to the third mounting bed 60b by the drain electrode 41b having an ohmic connection with the third mounting bed 60b.

Although not illustrated in FIG. 3, the gate electrode of the first semiconductor element 40a is electrically connected to the first gate terminal 43a shown in FIG. 2 via a bonding wire. Also, the gate electrode of the second semiconductor element 40b is electrically connected to the second gate terminal 43b shown in FIG. 2 via a bonding wire.

In the example as shown in FIGS. 2 and 3, the first diode 30a and the second diode 30b are located on the first mounting bed 20. The anode electrode 31a of the first diode 30a is connected to the first mounting bed 20. The anode electrode 31b of the second diode 30b is connected to the first mounting bed 20. The first diode 30a and the second diode 30b each are vertical semiconductor elements; and the anode electrodes 31a and 31b are formed at the back surfaces of the diodes. The anode electrodes 31a and 31b each are electrically connected to the first mounting bed 20 by the anode electrodes 31a and 31b having ohmic connections with the first mounting bed 20.

One end portion of a bonding wire MW3a is connected to the cathode electrode 32a of the first diode 30a. The other end portion of the bonding wire MW3a is connected to the second mounting bed 60a. The cathode electrode 32a of the first diode 30a and the drain electrode 41a of the first semiconductor element 40a are electrically connected via the bonding wire MW3a and the second mounting bed 60a because the second mounting bed 60a is connected to the drain electrode 41a of the first semiconductor element 40a.

One end portion of a bonding wire MW3b is connected to the cathode electrode 32b of the second diode 30b. The other end portion of the bonding wire MW3b is connected to the third mounting bed 60b. The cathode electrode 32b of the second diode 30b and the drain electrode 41b of the second semiconductor element 40b are electrically connected via the bonding wire MW3b and the third mounting bed 60b because the third mounting bed 60b is connected to the drain electrode 41b of the second semiconductor element 40b.

The second mounting bed 60a is connected to the first output terminal 70a via a bonding wire MW4a. The second mounting bed 60a is connected to the anode electrode 31a of the first diode 30a and the drain electrode 41a of the first semiconductor element 40a. Therefore, the first output terminal 70a is electrically connected to the anode electrode 31a of the first diode 30a and the drain electrode 41a of the first semiconductor element 40a via the bonding wire MW4a and the second mounting bed 60a.

The third mounting bed 60b is connected to the second output terminal 70b via a bonding wire MW4b. The third mounting bed 60b is connected to the anode electrode 31b of the second diode 30b and the drain electrode 41b of the second semiconductor element 40b. Therefore, the second output terminal 70b is electrically connected to the anode electrode 31b of the second diode 30b and the drain electrode 41b of the second semiconductor element 40b via the bonding wire MW4b and the third mounting bed 60b.

In the example, because the first diode 30a and the second diode 30b are vertical semiconductor elements, the first diode 30a and the second diode 30b can be mounted on the same first mounting bed 20 as the nitride semiconductor element 10. Thereby, the anode electrodes 31a and 31b of these diodes can be electrically connected to the nitride semiconductor element 10 via ohmic connections; therefore, wiring parts such as bonding wires, etc., can be omitted. When the anode electrodes of the first and second diodes 30a and 30b are formed at the surfaces of the diodes, a structure is possible in which the first diode 30a is located on the second mounting bed 60a, the second diode 30b is located on the third mounting bed 60b, and the anode electrodes of the first and second diodes 30a and 30b are connected with bonding wires to the first mounting bed 20.

In the example, the first semiconductor element 40a and the second semiconductor element 40b are taken to be vertical semiconductor elements. Thereby, the first semiconductor element 40a and the second semiconductor element 40b can be mounted respectively to the second and third mounting beds 60a and 60b and can have ohmic connections. The second mounting bed 60a and the third mounting bed 60b can be formed from the same material as the first mounting bed 20; and the semiconductor device 100 can be easily made in a single package by sealing the semiconductor elements and the terminals with a resin, etc.

Operations of the semiconductor device 100 according to the embodiment will now be described.

A method of use that includes a specific driving method is described below.

The semiconductor device 100 shown in FIG. 1 operates as a bidirectional switch. An external circuit is connected to the first and second output terminals 70a and 70b. The semiconductor device 100 operates in a first operation mode or a second operation mode according to the operation of the external circuit, etc.

The first operation mode is an operation mode in which the voltage applied to the first output terminal 70a is greater than the voltage applied to the second output terminal 70b. The second operation mode is an operation mode in which the voltage applied to the second output terminal 70b is greater than the voltage applied to the first output terminal 70a.

The nitride semiconductor element 10 is connected in series to the first semiconductor element 40a and connected in series to the second semiconductor element 40b as well. The first semiconductor element 40a and the second semiconductor element 40b are switched on in both the first operation mode and the second operation mode. The nitride semiconductor element 10 is switched on and off in this state. When the nitride semiconductor element 10 is on in the first operation mode, a current flows into the first output terminal 70a, and a current outflows out from the second output terminal 70b. When the nitride semiconductor element 10 is on in the second operation mode, a current flows into the second output terminal 70b, and a current outflows out from the first output terminal 70a.

In the first operation mode, the voltage that is applied to the second output terminal 70b is sufficiently less than the voltage applied to the first output terminal 70a. Therefore, the second diode 30b has a forward bias, and the first diode 30a has a reverse bias. Because the second diode 30b has a forward bias, the voltages of the substrate 11 and the second SD electrode 15b are substantially equal to the voltage of the second output terminal 70b.

A voltage that is greater than the first threshold voltage is applied between the first control terminal 18a and the first power supply terminal 16a. A channel that is formed of a two-dimensional electron gas is formed under the first gate electrode 17a.

When a voltage that is greater than the second threshold voltage is applied between the second control terminal 18b and the second power supply terminal 16b in this state, a channel is formed under the second gate electrode 17b; and the nitride semiconductor element 10 is switched on.

To switch the semiconductor device 100 off in the first operation mode, the voltage that is applied between the second control terminal 18b and the second power supply terminal 16b is set to be less than the second threshold voltage.

In the second operation mode, the voltage that is applied to the first output terminal 70a is sufficiently less than the voltage applied to the second output terminal 70b. Therefore, the first diode 30a has a forward bias, and the second diode 30b has a reverse bias. Because the first diode 30a has a forward bias, the voltages of the substrate 11 and the first SD electrode 15a are substantially equal to the voltage of the first output terminal 70a.

A voltage that is greater than the second threshold voltage is applied between the second control terminal 18b and the second power supply terminal 16b. A channel that is formed of a two-dimensional electron gas is formed under the second gate electrode 17b.

When a voltage that is greater than the first threshold voltage is applied between the first control terminal 18a and the first power supply terminal 16a in this state, a channel is formed under the first gate electrode 17a; and the nitride semiconductor element 10 is on.

To switch the semiconductor device 100 off in the second operation mode, the voltage that is applied between the first control terminal 18a and the first power supply terminal 16a is set to be less than the first threshold voltage.

Thus, in both the first operation mode and the second operation mode, a voltage that is substantially equal to the voltage applied to the SD electrodes at the low-voltage side is applied to the substrate 11 used as the back gate of the nitride semiconductor element 10. Therefore, the electric fields between the SD electrodes at the high-voltage side can be relaxed, and the current collapse phenomenon can be less likely to occur.

A method of use of the semiconductor device 100 according to the embodiment will now be described.

A specific example of a driving method of the semiconductor device 100 will now be described as the method of use of the semiconductor device 100.

Figure 4:
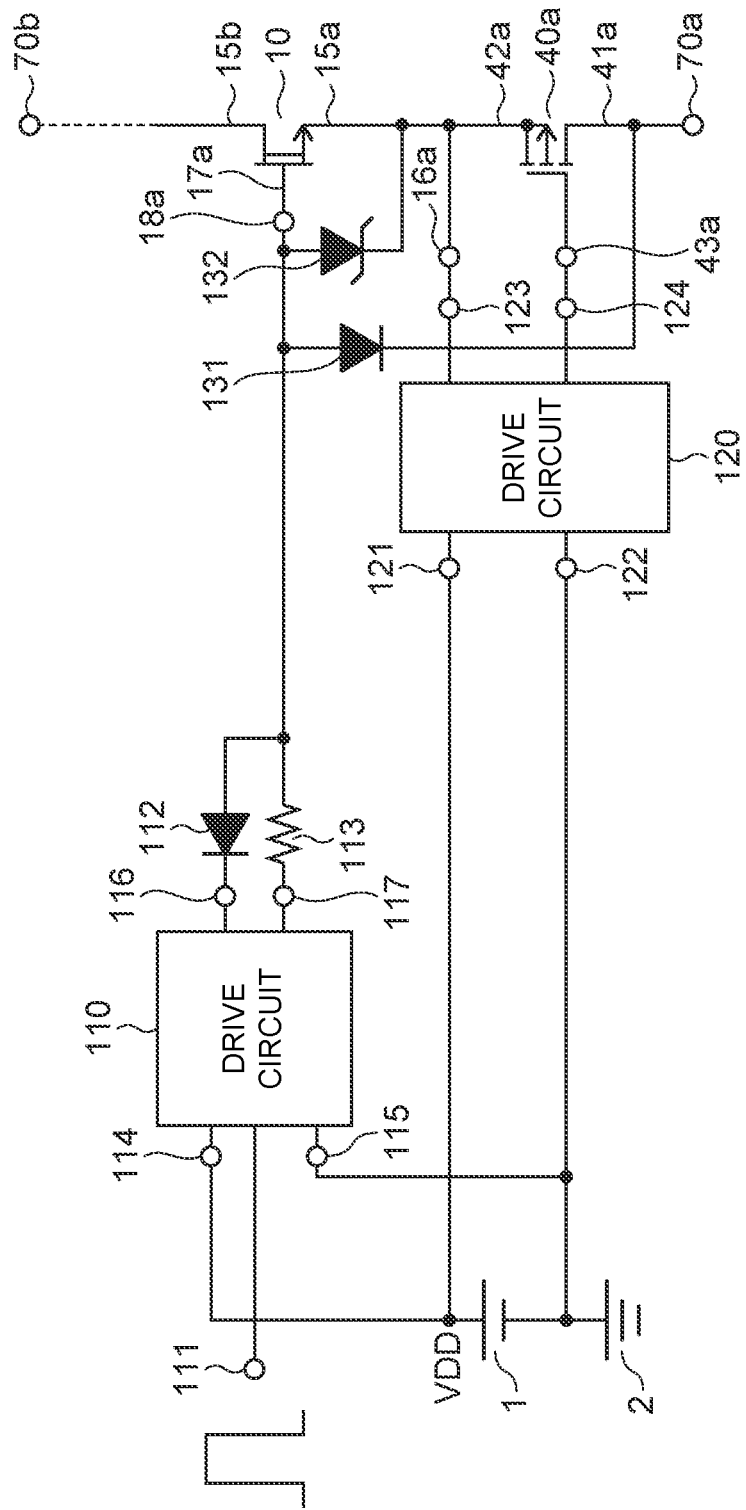
FIG. 4 is an example of a circuit diagram for describing a method of use of the semiconductor device according to the first embodiment.

FIG. 4 is an example of a circuit diagram for describing the method of use of the semiconductor device according to the first embodiment.

FIG. 4 shows the nitride semiconductor element 10 and the first semiconductor element 40a in the second operation mode. The second semiconductor element 40b and the second gate electrode 17b of the nitride semiconductor element 10 are not illustrated in FIG. 4 to avoid complexity. The method of use of the semiconductor device 100 in the first operation mode can be described similarly to the following description by interchanging the first output terminal 70a and the second output terminal 70b and by replacing the first semiconductor element 40a with the second semiconductor element 40b; and a detailed description is therefore omitted. The operations of the first and second diodes 30a and 30b are as described above; and a description is omitted.

The first SD electrode 15a of the nitride semiconductor element 10 is connected to the source electrode 42a of the first semiconductor element 40a. The drain electrode 41a of the first semiconductor element 40a is connected to the first output terminal 70a.

Drive circuits 110 and 120 are used when using the semiconductor device 100 according to the embodiment. A DC power supply 1 is connected to the drive circuit 110 via terminals 114 and 115. A ground 2 is connected to the terminal 115 and the low-voltage side of the DC power supply 1. The DC power supply 1 outputs a direct current power supply voltage VDD. The power supply voltage VDD has a positive voltage value with respect to the voltage applied to the ground 2. The power supply voltage VDD is a DC voltage that is sufficiently greater than the absolute value of the first threshold voltage between the first gate electrode 17a and the first SD electrode 15a. The power supply voltage VDD is, for example, 15 V. Unless otherwise noted hereinbelow, the voltage that is applied to the ground 2 is used as the reference, and the reference voltage is 0 V.

For example, the power supply voltage VDD is the voltage value when referenced to 0 V.

For example, a pulse signal or a step signal is input to a signal input terminal 111 of the drive circuit 110. The signal that is input to the signal input terminal 111 is, for example, a pulse signal or a step signal having an amplitude of 5 V; the high-level voltage is 5 V; and the low-level voltage is 0 V. The drive circuit 110 outputs the signal input to the signal input terminal 111 after performing level conversion of the signal. The drive circuit 110 has a current capability that can charge and discharge the parasitic capacitance of the nitride semiconductor element 10, which includes a Miller capacitance, at a sufficient rate. For example, the drive circuit 110 outputs a pulse signal or a step signal having a high-level voltage of 15 V and a low-level voltage of 0 V.

In the example, the output circuit of the drive circuit 110 uses separate output terminals for the on-output and the off-output. An output terminal 117 is the output terminal for the on-output; and an output terminal 116 is the output terminal for the off-output. When outputting the high-level voltage, the drive circuit 110 outputs the output signal via the output terminal 117. When outputting the low-level voltage, the drive circuit 110 outputs the output signal via the output terminal 116. In the example, a diode 112 is connected between the output terminal 116 and the first control terminal 18a. A resistor 113 that is connected between the output terminal 117 and the first control terminal 18a is provided to set the current that charges the parasitic capacitance of the nitride semiconductor element 10 and adjust the turn-on time of the nitride semiconductor element 10. At turn-off of the nitride semiconductor element 10, the parasitic capacitance of the nitride semiconductor element 10 is discharged at a low impedance via the diode 112.

A diode 132 that is connected between the first control terminal 18a and the first power supply terminal 16a is a Zener diode. The diode 132 is provided so that an excessive reverse voltage is not applied to the first gate electrode 17a. A diode 131 that is connected between the first control terminal 18a and the first output terminal 70a is provided to prevent the voltage of the first gate electrode 17a from being greater than the voltage of the first output terminal 70a.

The DC power supply 1 is connected to the drive circuit 120 via terminals 121 and 122. The ground 2 is connected to the terminal 122. An output terminal 123 of the drive circuit 120 is connected to the first power supply terminal 16a. An output terminal 124 of the drive circuit 120 is connected to the first control terminal 18a.

The drive circuit 120 receives the input of the power supply voltage VDD supplied from the DC power supply 1 and applies the power supply voltage VDD to the first power supply terminal 16a via the output terminal 123. The drive circuit 120 receives the input of the power supply voltage VDD supplied from the DC power supply 1 and applies 0 V to the gate terminal 43a of the first semiconductor element 40a via the output terminal 124. The first semiconductor element 40a is switched on by the output of the drive circuit 120 because the power supply voltage VDD is sufficiently greater than the absolute value of the threshold voltage of the first semiconductor element 40a.

Favorably, the drive circuit 120 has a low-voltage lockout function. At the startup of the DC power supply 1, etc., when the power supply voltage output by the DC power supply 1 is less than a prescribed value, the drive circuit 120 outputs, to the gate terminal 43a, a lower voltage than the absolute value of the threshold of the first semiconductor element 40a via the output terminal 124. The first semiconductor element

40a is switched off because a lower voltage than the absolute value of the threshold voltage is applied between the source electrode 42a and the gate terminal 43a of the first semiconductor element 40a.

When the power supply voltage output by the DC power supply 1 reaches or exceeds the prescribed value, the drive circuit 120 outputs 0 V to the gate terminal 43a via the output terminal 124. The first semiconductor element 40a is switched on because a voltage that is not less than the absolute value of the threshold voltage is applied between the source electrode 42a and the gate terminal 43a of the first semiconductor element 40a. The low-voltage lockout release voltage, i.e., the prescribed value of the power supply voltage at which low-voltage lockout is released, is, for example, VDD×0.9. When VDD=15 V, the low-voltage lockout release voltage is 13.5 V. The output terminal 124 outputs 13.5 V to the gate terminal. The low-voltage lockout release voltage is sufficiently greater than the threshold voltage of the first semiconductor element 40a.

Operations of the nitride semiconductor element 10 and the first semiconductor element 40a when using the drive circuits 110 and 120 will now be described.

The power supply voltage VDD is supplied to the drive circuits 110 and 120 by the DC power supply 1. At the startup, the DC power supply 1 rises from 0 V. When the DC voltage output by the DC power supply 1 is less than the low-voltage lockout release voltage, the drive circuit 120 outputs, from the output terminal 124, a voltage substantially equal to the DC voltage output by the DC power supply 1. Therefore, the voltage that is applied between the source electrode 42a and the gate electrode 43a of the first semiconductor element 40a is less than the threshold voltage; and the first semiconductor element 40a is off.

At this time, the drive circuit 110 outputs the low-level voltage when a signal is not input to the signal input terminal 111 of the drive circuit 110. The low-level voltage is the voltage of the ground 2, e.g., 0 V. Therefore, a voltage that is less than the voltage applied to the first control terminal 18a by the amount of the power supply voltage output by the DC power supply 1 is applied to the first power supply terminal 16a. When the voltage applied between the first control terminal 18a and the first power supply terminal 16a is less than the absolute value of the first threshold voltage, the nitride semiconductor element 10 is on. That is, at the startup of the DC power supply 1, in the state in which the DC voltage output by the DC power supply 1 has not reached the low-voltage lockout release voltage, the nitride semiconductor element 10, which is a normally-on HEMT, is in the on-state, and the first semiconductor element 40a is off. Therefore, the semiconductor device 100 as an entirety is in the off-state.

When the DC voltage output by the DC power supply 1 reaches or exceeds the low-voltage lockout release voltage, the drive circuit 120 applies a power supply voltage that is not less than the low-voltage lockout release voltage between the source electrode 42a and the gate terminal 43a of the first semiconductor element 40a via the output terminals 123 and 124. For example, the low-voltage lockout release voltage is 13.5 V; and a voltage that is less than that of the source electrode 42a by 13.5 V is applied to the gate terminal 43a of the first semiconductor element 40a. The absolute value of the threshold voltage of the first semiconductor element 40a is, for example, about 2 V to 3 V; and the first semiconductor element 40a is switched on.

By switching the first semiconductor element 40a on, the voltage of the first power supply terminal 16a becomes greater than 0 V by the amount of the low-voltage lockout release voltage. On the other hand, the drive circuit 110 outputs the voltage of the ground 2. Therefore, a voltage that is less than that of the first power supply terminal 16a by the amount of the low-voltage lockout release voltage is applied to the first control terminal 18a. The low-voltage lockout release voltage is set to be greater than the absolute value of the first threshold voltage of the nitride semiconductor element 10. Therefore, the nitride semiconductor element 10 is switched to the off-state.

Thereafter, as described using FIG. 1, the voltage applied between the first gate electrode 17a and the first SD electrode 15a is controlled according to the polarity of the voltage between the first output terminal 70a and the second output terminal 70b; and a current that flows in two directions can be controlled by controlling the voltage applied between the second gate electrode 17b and the second SD electrode 15b.

The nitride semiconductor element 10 is on when the DC power supply 1 outputs a voltage that is less than the low-voltage lockout release voltage; therefore, the voltage between the first output terminal 70a and the second output terminal 70b is applied between the drain and the source of the first semiconductor element 40a. When the DC power supply 1 outputs a voltage that is less than the low-voltage lockout release voltage, the breakdown voltage between the drain and the source of the first semiconductor element 40a can be set to be low by presetting the voltage applied between the first output terminal 70a and the second output terminal 70b to be sufficiently low. This is similar for the second semiconductor element 40b as well; and low-breakdown-voltage low-on-resistance compact p-channel MOSFETs can be utilized as the first and second semiconductor elements 40a and 40b.

Effects of the semiconductor device 100 according to the embodiment will now be described.

The semiconductor device 100 according to the embodiment includes the nitride semiconductor element 10, the first diode 30a, and the second diode 30b. The nitride semiconductor element 10 includes the first nitride semiconductor layer 12, the second nitride semiconductor layer 13, the first SD electrode 15a, the second SD electrode 15b, the first gate electrode 17a, and the second gate electrode 17b. The second nitride semiconductor layer 13 is located on the first nitride semiconductor layer 12. The first nitride semiconductor layer 12 and the second nitride semiconductor layer 13 are joined by a heterojunction. The first SD electrode 15a, the second SD electrode 15b, the first gate electrode 17a, and the second gate electrode 17b are located on the second nitride semiconductor layer 13. The anode electrode 31a of the first diode 30a has an ohmic connection with the first mounting bed 20 and has an ohmic connection with the substrate 11 via the first mounting bed 20. The anode electrode 31b of the second diode 30b has an ohmic connection with the first mounting bed 20 and has an ohmic connection with the substrate 11 via the first mounting bed 20. The cathode electrode 32a of the first diode 30a is electrically connected to the first SD electrode 15a. The cathode electrode 32b of the second diode 30b is electrically connected to the second SD electrode 15b.

Accordingly, when the voltage applied to the first SD electrode 15a is greater than the voltage applied to the second SD electrode 15b, the first diode 30a has a reverse bias, and the second diode 30b has a forward bias. Therefore, the substrate 11, i.e., the back gate, becomes substantially equal to the voltage applied to the second SD electrode 15b. The second SD electrode 15b functions as the source electrode of the nitride semiconductor element 10; and the first SD electrode 15a functions as the drain electrode of the nitride semiconductor element 10. Therefore, even when the voltage applied to the first SD electrode 15a is sufficiently greater than the voltage applied to the second SD electrode 15b, the current collapse phenomenon can be less likely to occur, and the nitride semiconductor element 10 functions as a low-on-resistance switching element.

When the voltage applied to the second SD electrode 15b is greater than the voltage applied to the first SD electrode 15a, the second diode 30b has a reverse bias, and the first diode 30a has a forward bias. Therefore, the substrate 11, i.e., the back gate, becomes substantially equal to the voltage applied to the first SD electrode 15a; therefore, the first SD electrode 15a functions as the source electrode of the nitride semiconductor element 10; and the second SD electrode 15b functions as the drain electrode of the nitride semiconductor element 10. Therefore, even when the voltage applied to the second SD electrode is sufficiently greater than the voltage applied to the first SD electrode 15a, the current collapse phenomenon can be less likely to occur, and the nitride semiconductor element 10 functions as a low-on-resistance switching element.

The connection of the substrate 11, i.e., the back gate of the nitride semiconductor element 10, to the SD terminals to which a lower voltage is applied is automatically switched by the first and second diodes 30a and 30b. Therefore, according to the semiconductor device 100 according to the embodiment, a high-breakdown-voltage low-on-resistance bidirectional switching device can be realized without providing any switching circuit.

There are increasing examples of power storage equipment installed in solar power plants for power leveling, etc. It is necessary for such power storage equipment to include a power conversion device for appropriately charging a storage battery and for appropriately discharging from the charged storage battery. In a power conversion device of such an application, it is necessary to control current flowing in two directions; and a high-breakdown-voltage low-loss bidirectional switching device is desirable.

There are high expectations for the application of lateral switching elements that use a nitride semiconductor such as GaN or the like in bidirectional switching devices such as that described above because the wide bandgap makes it easy to increase the breakdown voltage and have a high-temperature operation, as well as making it possible to reduce the on-resistance due to the two-dimensional electron gas.

On the other hand, in a switching element that uses a nitride semiconductor such as GaN or the like, attention has been called to the degradation of characteristics due to the current collapse phenomenon. In contrast, the current collapse phenomenon has been effectively improved by fixing the back gate at the minimum potential by connecting to the source electrode, by using the source electrode or the like to form a field plate, etc.

A bidirectional switch in which the current collapse phenomenon is improved can be realized by using two normal HEMTs including GaN that each include a source electrode, a drain electrode, and a gate electrode, by connecting the drain electrodes to each other, and by connecting one of the back gates to the low potential terminal. However, in such a case, the two HEMTs including GaN would be connected in series; and to lower the on-resistance to the desired value, it would be necessary to connect the HEMTs including GaN in parallel. Therefore, the cost for realizing the bidirectional switch is increased, and the mounting space is undesirably enlarged.

In the semiconductor device 100 according to the embodiment as described above, the substrate 11, i.e., the back gate of the nitride semiconductor element 10, can be electrically connected to the SD electrode of the low-voltage side via the first mounting bed 20 and the diode. Thereby, the SD electrode of the low-voltage side functions as the source electrode of the HEMT including GaN; and the SD electrode of the high-voltage side functions as the drain electrode of the HEMT. Accordingly, a bidirectional switch can be realized using one semiconductor device 100 without connecting two HEMTs in series.

The diodes that are connected between the substrate 11 and the SD electrodes are provided to maintain the potential of the substrate 11 at the potential of the SD electrode. Therefore, substantially no current flows in these two diodes. Therefore, low-capacity diode can be utilized, which does not increase the cost or space requirements.

In the semiconductor device 100 according to the embodiment, the source electrodes of the p-channel MOSFETs are connected to the SD electrodes. By connecting the DC power supply 1 to switch the p-channel MOSFETs on, a circuit can be easily configured in which a voltage that is not more than the threshold is applied between the SD electrode and the gate electrode of the nitride semiconductor element 10. Thus, by using a circuit configuration, it is unnecessary to add a power supply circuit that outputs a negative voltage to the drive circuit of the nitride semiconductor element 10 which is a normally-on HEMT. Such a circuit configuration can contribute to reducing the mounting space and suppressing higher costs.

Second Embodiment

Figure 5:
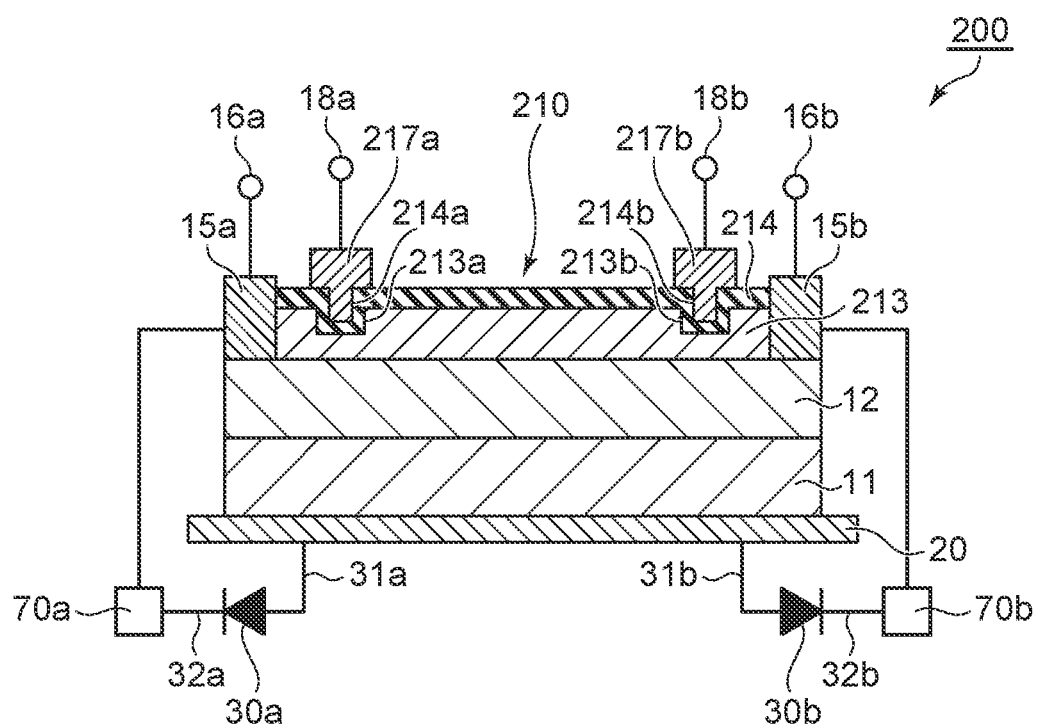
FIG. 5 is a schematic view illustrating a semiconductor device according to a second embodiment.

FIG. 5 is a schematic view illustrating a semiconductor device according to a second embodiment.

As shown in FIG. 5, the semiconductor device 200 according to the embodiment includes a nitride semiconductor element 210, the first diode 30a, and the second diode 30b. The configuration of the nitride semiconductor element 210 of the semiconductor device 200 according to the embodiment is different from that of the semiconductor device 100 according to the first embodiment. Also, the semiconductor device 200 according to the embodiment differs from the semiconductor device 100 according to the first embodiment in that the first semiconductor element 40a and the second semiconductor element 40b, i.e., the p-channel MOSFETs, are not included. The same components are marked with the same reference numerals; and a detailed description is omitted as appropriate.

The nitride semiconductor element 210 includes the substrate 11, the first nitride semiconductor layer 12, a second nitride semiconductor layer 213, an oxide film 214 (or other insulating film such as a nitride film), the first SD electrode 15a, the second SD electrode 15b, the first gate electrode 17a, and the second gate electrode 17b. The second nitride semiconductor layer 213 is located on the first nitride semiconductor layer 12. Similarly to the semiconductor device 100 according to the first embodiment, the first nitride semiconductor layer 12 is, for example, an undoped GaN layer. The second nitride semiconductor layer 213 is, for example, an AlGaN layer.

The second nitride semiconductor layer 213 includes recesses 213a and 213b in the surface on which the oxide film 214 is located. The recesses 213a and 213b are, for example, trenches and are formed on the surface of the second nitride semiconductor layer 213. The recesses 213a and 213b are located between the first SD electrode 15a and the second SD electrode 15b. The recess 213a is located between the first SD electrode 15a and the recess 213b. The recess 213b is located between the second SD electrode 15b and the recess 213a. The recess 213a is located at the vicinity of the first SD electrode 15a; and the recess 213b is located at the vicinity of the second SD electrode 15b.

The oxide film 214 includes recesses 214a and 214b located on the second nitride semiconductor layer 213. The recess 214a is located on the recess 213a of the second nitride semiconductor layer 213; and the recess 214b is located on the recess 213b of the second nitride semiconductor layer 213. For example, the oxide film 214 is located between the sidewall of the recess 213a and the sidewall of the recess 214a. The oxide film 214 is located between the bottom portion of the recess 213a and the bottom portion of the recess 214a. For example, the oxide film 214 is formed of $SiO_2$. The oxide film 214 may be a stacked film of $SiO_2$ and another insulating film.

A first gate electrode 217a fills the recess 214a. A second gate electrode 217b fills the recess 214b.

According to the embodiment, by providing the first gate electrode 217a and the second gate electrode 217b on the second nitride semiconductor layer 213 with the oxide film 214 interposed, the nitride semiconductor element 210 can have a MOS (Metal-Oxide-Semiconductor)-type structure. In the nitride semiconductor element 210, by providing the recesses in the second nitride semiconductor layer 213 and the oxide film 214 and by providing the first gate electrode 217a and the second gate electrode 217b to fill the recesses, a stable normally-off HEMT can be made.

In the semiconductor device 200 according to the embodiment, by using a normally-off HEMT as the nitride semiconductor element 210, a bidirectional switching device can be realized without providing a negative power supply for the on/off-control of the nitride semiconductor element 210.

The nitride semiconductor element 210 is located on the first mounting bed 20; and the first nitride semiconductor layer 12 is connected to the first mounting bed 20 via the substrate 11. The anode electrode 31a of the first diode 30a is connected to the first mounting bed 20; and the cathode electrode 32a of the first diode 30a is connected to the first SD electrode 15a. The first output terminal 70a is connected to the first SD electrode 15a and the cathode electrode 32a of the first diode 30a.

The anode electrode 31b of the second diode 30b is connected to the first mounting bed 20; and the cathode electrode 32b of the second diode 30b is connected to the second SD electrode 15b. The second output terminal 70b is connected to the second SD electrode 15b and the cathode electrode 32b of the second diode 30b.

The first diode 30a and the second diode 30b can be vertical semiconductor elements. Thereby, similarly to the semiconductor device 100 according to the first embodiment, the anode electrodes of the first and second diodes 30a and 30b may have ohmic connections on the first mounting bed 20.

The nitride semiconductor element 210 is a normally-off HEMT. The channel that is formed of the two-dimensional electron gas formed in the first nitride semiconductor layer 12 is blocked by applying a voltage that is less than a third threshold voltage between the first gate electrode 217a and the first SD electrode. The channel that is formed of the two-dimensional electron gas is formed by applying a voltage that is not less than the third threshold voltage between the first gate electrode 217a and the first SD electrode.

The third threshold voltage is defined as the voltage applied to the first gate electrode 217a when referenced to the voltage applied to the first SD electrode 15a. The third threshold voltage is a positive voltage value with respect to the voltage applied to the first SD electrode 15a.

The channel that is formed of the two-dimensional electron gas is blocked by applying a lower voltage than a fourth threshold voltage between the second gate electrode 217b and the second SD electrode 15b. The channel that is formed of the two-dimensional electron gas is formed by applying a voltage that is not less than the fourth threshold voltage between the second gate electrode 217b and the second SD electrode 15b. The fourth threshold voltage is defined as the voltage applied to the second gate electrode 217b when referenced to the voltage applied to the second SD electrode 15b. The fourth threshold voltage is a positive voltage value with respect to the voltage applied to the second SD electrode 15b. The second threshold voltage is substantially equal to the first threshold voltage.

Operations of the semiconductor device 200 according to the embodiment will now be described.

The semiconductor device 200 shown in FIG. 5 operates as a bidirectional switch. An external circuit is connected to the first and second output terminals 70a and 70b. The semiconductor device 200 operates in one of the first operation mode or the second operation mode according to the operation, state, and the like of the external circuit.

The first operation mode and the second operation mode are the same as those of the semiconductor device 100 according to the first embodiment. In other words, the first operation mode is the operation mode in which the voltage applied to the first output terminal 70a is greater than the voltage applied to the second output terminal 70b. The second operation mode is the operation mode in which the voltage applied to the second output terminal 70b is greater than the voltage applied to the first output terminal 70a.

In the first operation mode, the nitride semiconductor element 10, the first diode 30a, and the second diode 30b operate as follows. A higher voltage than the voltage applied to the second output terminal 70b is applied to the first output terminal 70a.

A channel is pre-formed under the first gate electrode 217a in a state in which a voltage that is greater than the threshold is applied between the first control terminal 18a and the first power supply terminal 16a.

The semiconductor device 100 is switched to the off-state by applying a voltage that is not more than the threshold between the second control terminal 18b and the second power supply terminal 16b.

In this state, the potential of the substrate 11 rises when a higher voltage than the second output terminal 70b is applied to the first output terminal 70a (the first operation mode). The substrate 11 is connected to the anode electrode 31b of the second diode 30b via the first mounting bed 20; and the cathode electrode 32b of the second diode 30b is connected to the second output terminal 70b. Therefore, the second diode 30b has a forward bias, and the voltage of the substrate 11 becomes substantially equal to the voltage of the second output terminal 70b; therefore, the potential of the substrate 11 is substantially the same potential as the second power supply terminal 16b functioning as the source electrode of the nitride semiconductor element 10. The first diode 30a has a reverse bias.

When a voltage that is greater than the threshold is applied between the second control terminal 18b and the second power supply terminal 16b in this state, a channel is formed under the second gate electrode 217b; and the nitride semiconductor element 210 is switched on.

In the second operation mode, the nitride semiconductor element 210, the first diode 30a, and the second diode 30b operate as follows. A higher voltage than the voltage applied to the first output terminal 70a is applied to the second output terminal 70b.

A channel is pre-formed under the second gate electrode 217b in a state in which a voltage that is greater than the threshold is applied between the second control terminal 18b and the second power supply terminal 16b.

The semiconductor device 100 is switched to the off-state by applying a voltage that is not more than the threshold between the second control terminal 18b and the second power supply terminal 16b.

The potential of the substrate 11 rises when a higher voltage than that of the first output terminal 70a is applied to the second output terminal 70b in this state (the second operation mode). The substrate 11 is connected to the anode electrode 31a of the first diode 30a via the first mounting bed 20; and the cathode electrode 32a of the first diode 30a is connected to the first output terminal 70a. Therefore, the first diode 30a has a forward bias, and the voltage of the substrate 11 becomes substantially equal to the voltage of the first output terminal 70a; therefore, the potential of the substrate 11 becomes substantially the same potential as the first power supply terminal 16a functioning as the source electrode of the nitride semiconductor element 10. The second diode 30b has a reverse bias.

When a voltage that is greater than the threshold is applied between the first control terminal 18a and the first power supply terminal 16a in this state, a channel is formed under the first gate electrode 217a; and the nitride semiconductor element 10 is switched on.

According to the embodiments described above, a semiconductor device that includes a nitride semiconductor element that is applicable to a bidirectional switch can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor device, comprising:
    a first mounting bed that is conductive;
    a second mounting bed that is conductive;
    a third mounting bed that is conductive;
    a nitride semiconductor element including
    a semiconductor substrate formed on the first mounting bed,
    a first nitride semiconductor layer formed on the semiconductor substrate,
    a second nitride semiconductor layer located on the first nitride semiconductor layer,
    a first source/drain electrode located on the first nitride semiconductor layer,
    a second source/drain electrode located on the first nitride semiconductor layer and separated from the major source/drain electrode,
    a first gate electrode located between the first source/drain electrode and the second source/drain electrode on the second nitride semiconductor layer, and
    a second gate electrode located between the first gate electrode and the second source/drain electrode on the second nitride semiconductor layer;
    a first diode laterally adjacent the nitride semiconductor element on the first mounting bed, the first diode including
    a first anode electrode electrically connected to the semiconductor substrate through the first mounting bed, and
    a first cathode electrode electrically connected to the first source/drain electrode through the second mounting bed; and
    a second diode laterally adjacent the nitride semiconductor element on the first mounting bed, the second diode including
    a second anode electrode electrically connected to the semiconductor substrate through the first mounting bed, and
    a second cathode electrode electrically connected to the second source/drain electrode through the second mounting bed.

2. The device according to claim 1, further comprising:
    a first semiconductor element connected between the first source/drain electrode and the first cathode electrode, the first semiconductor element being of a p-type; and
    a second semiconductor element connected between the second source/drain electrode and the second cathode electrode, the second semiconductor element being of the p-type.

3. The device according to claim 2, wherein the first semiconductor element is located on the second mounting bed, a first drain electrode of the first semiconductor element is connected to the second mounting bed, the second semiconductor element is located on the third mounting bed, and a second drain electrode of the second semiconductor element is connected to the third mounting substrate.

4. The device according to claim 1, wherein the first source/drain electrode includes a plurality of first portions arranged parallel to each other, the second source/drain electrode includes a second portion located between two adjacent first portions among the plurality of first portions, and the second portion is positioned at ½ of a distance between the two adjacent first portions.

5. The device according to claim 1, wherein
    the nitride semiconductor element is a normally-on HEMT.

6. The device according to claim 1, wherein
    the nitride semiconductor element further includes a dielectric film located on the second nitride semiconductor layer, and
    the first gate electrode and the second gate electrode are located on the second nitride semiconductor layer with the dielectric film interposed.

7. A semiconductor device, comprising:
    a first mounting bed that is conductive;
    a second mounting bed that is conductive;
    a third mounting bed that is conductive;
    a nitride semiconductor element including
    a semiconductor substrate formed on the mounting bed,
    a first nitride semiconductor layer formed on the semiconductor substrate,
    a second nitride semiconductor layer located on the first nitride semiconductor layer,
    a first source/drain electrode located on the first nitride semiconductor layer, a second source/drain electrode located on the first nitride semiconductor layer and separated from the first source/drain electrode, a first gate electrode located between the first source/drain electrode and the second source/drain electrode on the second nitride semiconductor layer, a second gate electrode located between the first gate electrode and the second source/drain electrode on the second nitride semiconductor layer;

a first semiconductor element on the second mounting bed and having a first drain electrode electrically connected to the semiconductor substrate through the second mounting bed and the first mounting bed;

a second semiconductor element on the third mounting bed and having a second drain electrode electrically connected to the semiconductor substrate through the third mounting bed and the first mounting bed;

wherein a voltage of the semiconductor substrate is equal to a voltage applied to the second source/drain electrode when a voltage applied to the first source/drain electrode is greater than the voltage applied to the second source/drain electrode and the voltage of the semiconductor substrate is equal to the voltage applied to the first source/drain electrode when the voltage applied to the second source/drain electrode is greater than the voltage applied to the first major electrode.

* * * * *